United States Patent [19]
Lo et al.

[11] Patent Number: 5,908,659
[45] Date of Patent: *Jun. 1, 1999

[54] METHOD FOR REDUCING THE REFLECTIVITY OF A SILICIDE LAYER

[75] Inventors: Yung-Tsun Lo, Yi Lan Hsien; Chyi-Tsong Ni, Hsinchu; Cheng-Hsun Tsai; Yui-Ping Huang, both of Taichung, all of Taiwan

[73] Assignee: Mosel Vitelic Inc., Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/775,375

[22] Filed: Jan. 3, 1997

[51] Int. Cl.⁶ .............................. B05D 5/12; B05D 3/02; C23C 16/42
[52] U.S. Cl. .............................. 427/96; 427/99; 427/255; 427/255.7; 427/376.6; 438/592
[58] Field of Search .............................. 427/96, 99, 255, 427/255.2, 255.3, 255.7, 376.6; 438/592

[56] References Cited

U.S. PATENT DOCUMENTS

| | | |
|---|---|---|
| Re. 32,207 | 7/1986 | Levinstein et al. .................. 427/96 |
| 4,522,845 | 6/1985 | Powell et al. .................. 437/173 |
| 4,557,943 | 12/1985 | Rosler et al. .................. 427/255.2 |
| 4,568,565 | 2/1986 | Gupta et al. .................. 427/255.2 |
| 4,619,038 | 10/1986 | Pintchovski .................. 427/255.2 |
| 4,684,542 | 8/1987 | Jasinski et al. .................. 427/255.2 |
| 4,766,006 | 8/1988 | Gaczi .................. 427/255.2 |
| 4,957,777 | 9/1990 | Ilderem et al. .................. 427/255.2 |
| 5,234,850 | 8/1993 | Liao .................. 437/34 |
| 5,268,330 | 12/1993 | Givens et al. .................. 438/675 |
| 5,350,698 | 9/1994 | Huang et al. .................. 427/255.3 |
| 5,441,914 | 8/1995 | Taft et al. .................. 438/592 |
| 5,604,157 | 2/1997 | Dai et al. .................. 438/592 |

Primary Examiner—Shrive Beck
Assistant Examiner—Bret Chen
Attorney, Agent, or Firm—Pillsbury Madison & Sutro LLP

[57] ABSTRACT

The present invention discloses a method for reducing the reflectivity of a silicide layer. This invention utilizes a rapid thermal oxidation process to treat a tungsten silicide film in order to reduce the reflectivity of the tungsten silicide film. Thus, an anti-reflectivity layer is not required in the present invention. In addition simplify the present invention, a thin oxide layer is growth on the tungsten suicide layer during the rapid thermal oxidation process and the thin oxide layer serves as a hard mask in subsequent steps. In addition, because utilizing the rapid thermal process, the present invention can greatly reduce the resistance of the tungsten silicide in order to increase the speed of the devices.

15 Claims, 2 Drawing Sheets

5,908,659

METHOD FOR REDUCING THE REFLECTIVITY OF A SILICIDE LAYER

FIELD OF THE INVENTION

The present invention relates to silicide process and, more particularly, to a method for reducing the reflectivity of a silicide layer.

BACKGROUND OF THE INVENTION

Typically, a tungsten silicide film is used combining with a polysilicon film, i.e. so called polycide structure, to reduce the resistance of the device. However, because the tungsten silicide film has high reflectivity (about 50% i-line) or the surface of the wafer has bad topography, the resolution of the photolithography is limited. Moreover, it results in uneven linewidth and a notching phenomena. In order to solve the phenomena, an anti-reflective coating layer is required to form on the tungsten silicide layer to decrease the reflectivity of the tungsten silicide layer. The anti-reflective coating layer can be a thin polysilicon layer (amorphous silicon), a titanium nitride layer, or an oxynitride layer ($Si_3N_4O_x$). Another method for solving the phenomena is that an oxide layer is formed on the tungsten silicide layer by using chemical vapor deposition before the photolithography process starts. The oxide layer with the patterned photoresist serves as a hard mask to enhance the function of etching mask when etching the wafer to form the polycide structure.

The two aforementioned methods are to increase the resolution of linewidth in the wafer, whether forming a thin polysilicon layer (amorphous silicon), a titanium nitride layer, or an oxynitride layer ($Si_3N_4O_x$) as an anti-reflective coating layer or an oxide layer as a hard mask. Unfortunately, the two conventional methods also increase the complexity of the process and burden in the production line so as to increase the cost of the product.

SUMMARY OF THE INVENTION

In accordance with the present invention, a method for reducing the reflectivity of a silicide layer is disclosed. In one embodiment, the method comprises forming a polysilicon layer on a substrate. A silicide layer is then formed on the polysilicon layer. Finally, the silicide layer is annealed and an oxide layer is grown during the annealing process. Consequently, unlike the conventional process, the silicide layer has the properties of low reflectivity and low resistance. In contrast to the conventional process, before patterning the polycide layer, an additional oxide layer serves as a hard mask and an anti-reflective coating layer are not required because of the low reflectivity property of the silicide layer.

BRIEF DESCRIPTION OF THE DRAWINGS

The forgoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The method of reducing the reflectivity of the silicide layer described herein include some process procedures that are well known in the art of semiconductor integrated circuit fabrication and, thus, need not be described in detail. For example, the various photolithographic and etching processes for patterning a layer are very well known and, therefore, the various steps of these processes are omitted.

Figure 1:
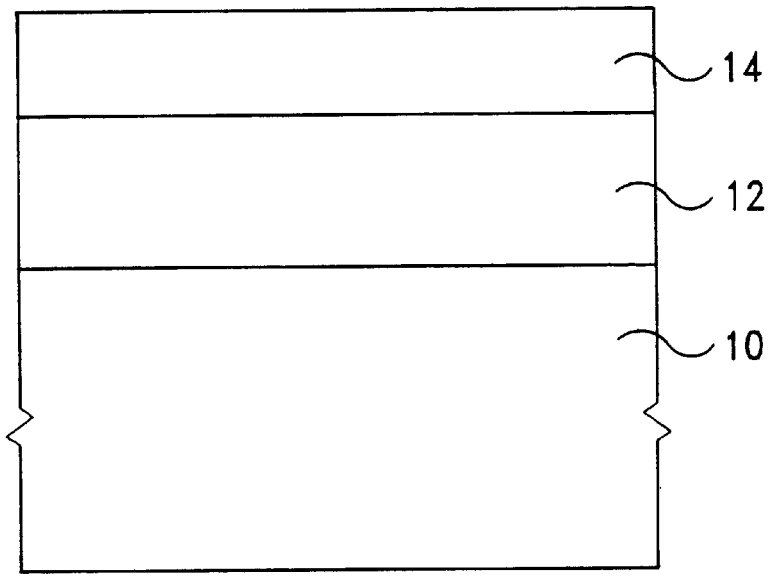
FIGS. 1, 2, and 3 are cross section views of a semiconductor wafer illustrating various stages of the method of the preferred embodiment of the present invention.

In accordance with one embodiment of the present invention, the structure shown in FIG. 1 is formed using any suitable process. The polysilicon layer 12 is deposited on the substrate 10. In this embodiment, the deposition is performed using a low pressure chemical vapor deposition process with the vapor source such as $SiC_4$ and $Cl_2$. The polysilicon layer 12 has a thickness of about 800–2000 angstroms. The silicide layer 14 is then formed on the polysilicon layer 12. In this embodiment, silicide layer is formed using a low pressure chemical vapor deposition process. The silicide layer 14 can be a tungsten silicide layer and has a thickness of about 1000–2000 angstroms.

Figure 2:
Figure 2:
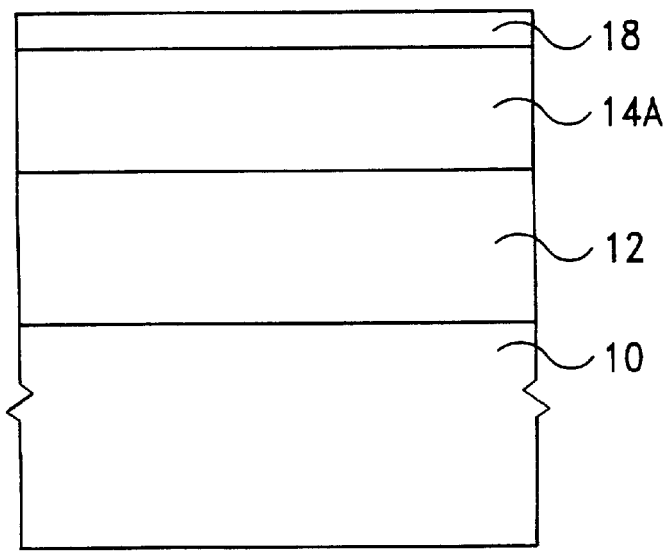

FIG. 2 illustrates a next stage of the embodiment of the present invention. The silicide layer 14 is then annealed to form the silicide layer 14A with low reflectivity. In this embodiment, the annealing step is performed using rapid thermal oxidation process. The rapid thermal oxidation process 16 is indicated by arrows 16 in the FIG. 2. The rapid thermal oxidation process 16 is performed using oxygen vapor with the flow rate of about 4–5 SLM. The temperature of the rapid thermal oxidation process 16 is controlled in the range of 1000° C. to 1500° C. and the time of the rapid thermal oxidation process 16 is about between 30 seconds to 60 seconds. After the rapid thermal oxidation process 16 is completed, the thin silicon dioxide layer 18 is already formed on the silicide layer 14A. During the rapid thermal oxidation process, the oxygen vapor participates to react with the surface of the silicide layer 14 to grow the silicon dioxide layer 18. In this embodiment, the silicon dioxide layer 18 has a thickness of about 50–150 angstroms.

After that, the reflectivity of the silicide layer 14A has greatly reduced. For example, a silicide layer with about 1300 angstroms thick has a reflectivity of about 50% (i-line). After the silicide layer is treated by a rapid thermal oxidation in 30 seconds, the reflectivity of the silicide layer is reduced to about 40% (i-line). If the silicide layer is treated by a rapid thermal oxidation in 60 seconds, then the reflectivity of the silicide layer is reduced to about 30% (i-line). Therefore, an anti-reflective coating layer is not required to form on the silicide layer. Furthermore, the resistance of the silicide layer substantially reduced. For example, a silicide layer with 1300 angstroms thick has a resistance of about 65 $\Omega/cm^2$. After the silicide layer is treated by a rapid thermal oxidation, the reflectivity of the silicide layer has a resistance of about 10 $\Omega/cm^2$. Because the resistance of the silicide layer becomes low, the RC time delay of the device is decreased and the operation speed of the device according to the present invention is faster than that of prior art devices.

Figure 3:
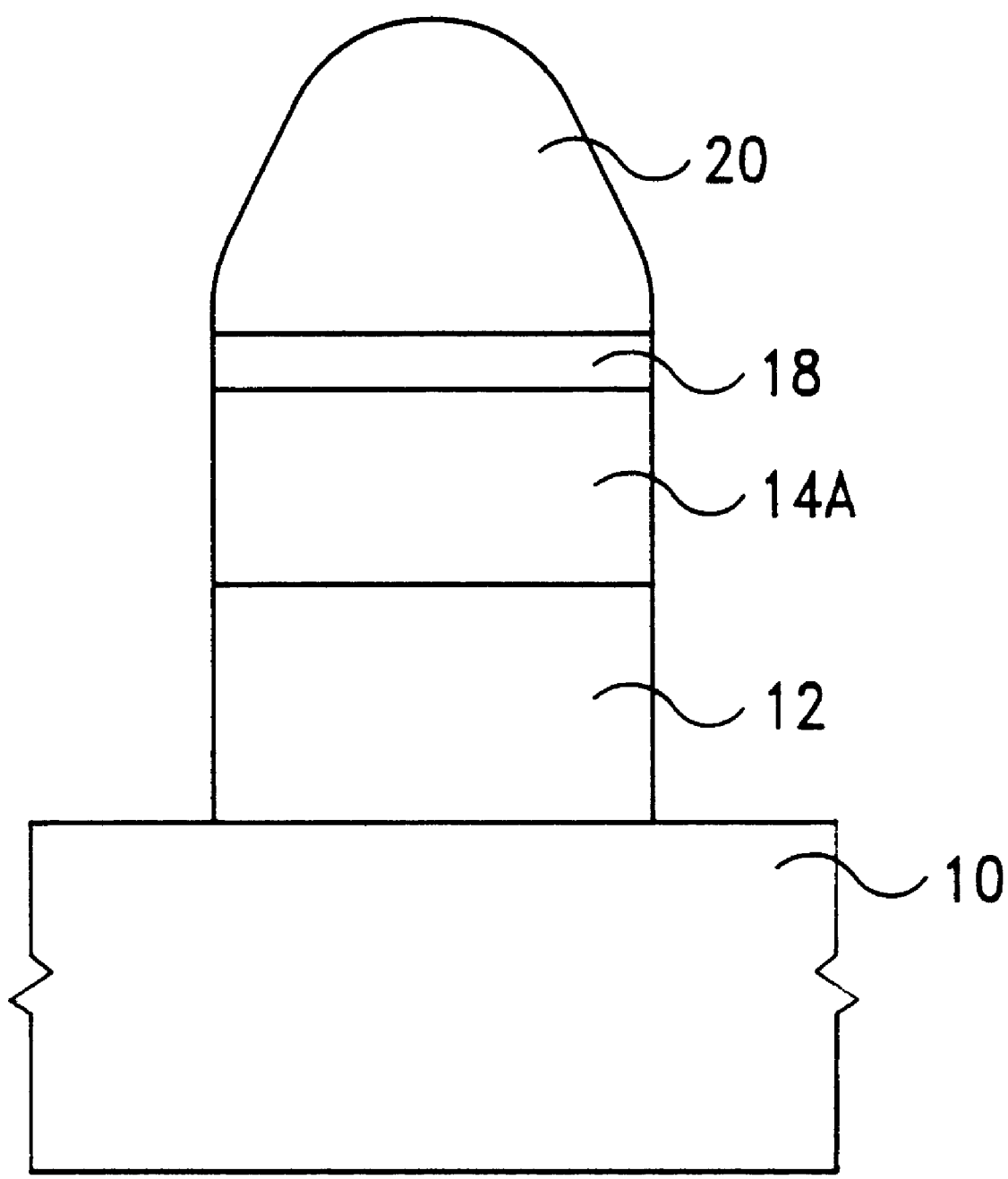

Another advantage of the method of this invention is that the thin silicon dioxide layer 18 formed on the silicide layer simplifies the subsequent process, i.e., patterning the polysilicon layer 12 and the silicide layer 14A. FIG. 3 shows a cross-section of the structure after patterning the polysilicon layer 12 and the silicide layer 14A. First, the photoresist layer 20 is formed and then the photoresist layer 20 is patterned on the silicide layer 14A. The polysilicon layer 12 and the silicide layer 14A which are not covered by the photoresist layer 20 are etched. The etching step is performed using any suitable etching process. The photoresist layer 20 is notched during the etching process so as to form the resulting structure as shown in FIG. 3. In this step, the silicon dioxide layer 18 serves as a hard mask, during the step of patterning the silicide layer 14A and the photoresist layer 20. The silicon dioxide layer 18 is combined with the photoresist layer 20 as masks in order to enhance the resistibility of the etching attack. Therefore, the method of this invention can be omit the step of forming an oxide layer on the silicide layer 14A which employees a chemical vapor deposition process to deposit.

Although specific embodiment has been illustrated and described, it will be obvious to those skilled in the art that various modifications may be made without departing from the spirit which is intended to be limited solely by the appended claims.

The embodiments of the invention in which an exclusive property or privilege is claimed are defined as follows:

1. A method of reducing the reflectivity of a tungsten silicide layer formed on a semiconductor substrate, said method comprising:

forming a polysilicon layer on said substrate;

forming said tungsten silicide layer on said polysilicon layer; and annealing said tungsten silicide layer to form an oxide layer by performing a rapid thermal oxidation process on said tungsten silicide layer thereby lowering the reflectivity of said tungsten silicide layer, wherein said oxide layer functions as a mask.

2. The method according to claim 1, wherein said polysilicon layer is about 800–2000 angstroms thick.

3. The method according to claim 1, wherein forming said polysilicon layer comprises depositing by using a low pressure chemical vapor deposition process.

4. The method according to claim 1, wherein forming said tungsten silicide layer comprises depositing said tungsten silicide layer by using a low pressure chemical vapor deposition process.

5. The method according to claim 1, wherein said tungsten silicide layer is about 1300 angstroms thick.

6. The method according to claim 1, wherein said rapid thermal oxidation process comprises using oxygen ($O_2$).

7. The method according to claim 6, wherein the flow rate of said oxygen ($O_2$) is about 4–5_SLM.

8. The method according to claim 6, wherein the temperature of said rapid thermal oxidation process is in the range of about 1000° C.–1500° C.

9. The method according to claim 6, wherein the time of said rapid thermal oxidation process is in the range of about 30–60 sec.

10. The method according to claim 1, wherein said oxide layer comprises a silicon dioxide layer.

11. The method according to claim 1, wherein said oxide layer is about 50–150 angstroms thick.

12. A method of reducing the reflectivity of a tungsten silicide layer formed on a semiconductor substrate, said method comprising:

forming a polysilicon layer on said substrate by using a chemical vapor deposition process;

forming said tungsten silicide layer on said polysilicon layer by using a chemical vapor deposition process; and annealing said tungsten silicide layer to form an oxide layer by performing a rapid thermal oxidation process on said tungsten silicide layer thereby lowering the reflectivity of said tungsten silicide layer, the temperature of said rapid thermal oxidation process is within the range of about 1000° C.–1500° C. and the duration of said rapid thermal oxidation process is about 30–60 sec, wherein said oxide layer functions as a mask.

13. The method according to claim 12, wherein said rapid thermal oxidation process comprises using oxygen ($O_2$).

14. The method according to claim 13, wherein the flow rate of said oxygen ($O_2$) is about 4–5_SLM.

15. The method according to claim 12, wherein the thickness of said oxide layer is about 50–150 angstroms.

* * * * *